US009768615B2

(12) United States Patent
Liberman

(10) Patent No.: US 9,768,615 B2
(45) Date of Patent: Sep. 19, 2017

(54) SYSTEM AND METHOD FOR PLANNING OF DEMAND FOR POWER ON AN ELECTRICAL POWER NETWORK

(71) Applicant: Lncon Systems Ltd., Tel Mond (IL)

(72) Inventor: Izidor Liberman, Tel Mond (IL)

(73) Assignee: Lncon Systems Ltd., Ashkelon (IL)

( * ) Notice: Subject to any disclaimer, the term of this patent is extended or adjusted under 35 U.S.C. 154(b) by 350 days.

(21) Appl. No.: 14/683,406

(22) Filed: Apr. 10, 2015

(65) Prior Publication Data

US 2015/0311715 A1    Oct. 29, 2015

Related U.S. Application Data

(63) Continuation of application No. 13/153,786, filed on Jun. 6, 2011, now abandoned.

(30) Foreign Application Priority Data

Jun. 7, 2010  (IL) .......................... 206232

(51) Int. Cl.
| | |
|---|---|
| H02J 3/00 | (2006.01) |
| H02J 3/14 | (2006.01) |
| G01R 21/133 | (2006.01) |
| G05B 15/02 | (2006.01) |
| H02J 3/38 | (2006.01) |

(52) U.S. Cl.
CPC ............ *H02J 3/005* (2013.01); *G01R 21/133* (2013.01); *H02J 3/14* (2013.01); *G05B 15/02* (2013.01); *H02J 3/00* (2013.01); *H02J 3/38* (2013.01); *H02J 2003/003* (2013.01); *H02J 2003/007* (2013.01); *Y02B 70/3225* (2013.01); *Y04S 10/54* (2013.01); *Y04S 20/222* (2013.01); *Y10T 307/391* (2015.04)

(58) Field of Classification Search
None
See application file for complete search history.

(56) References Cited

U.S. PATENT DOCUMENTS

| | | | |
|---|---|---|---|
| 4,135,101 | A | 1/1979 | Young et al. |
| 6,633,823 | B2 | 10/2003 | Bartone et al. |
| 6,745,109 | B2 | 6/2004 | Kojima et al. |
| 7,010,363 | B2 | 3/2006 | Donnelly et al. |
| 7,099,934 | B1 | 8/2006 | Ewing et al. |
| 7,454,270 | B2 | 11/2008 | Mansingh et al. |
| 7,813,814 | B2 | 10/2010 | Dittes |

(Continued)

FOREIGN PATENT DOCUMENTS

| | | |
|---|---|---|
| JP | 2004-072900 | 3/2004 |
| WO | WO 96/30843 | 10/1996 |
| WO | WO 2011/103262 | 8/2011 |

*Primary Examiner* — Tuan T Lam
(74) *Attorney, Agent, or Firm* — Pearl Cohen Zedek Latzer Baratz LLP

(57) ABSTRACT

A system and method for calculating energy to be preceded or delayed through a deactivation of appliance on a power network to reduce a highest threshold of power production required to meet power demand. Predictions of power demand by appliances and the possibility of preceding or delaying such demand away from a time of high power usage allow power use to be shifted away from periods of peak production. Further, such predictions allow more complete use of power once a power generator has been activated.

11 Claims, 9 Drawing Sheets

(56) References Cited

U.S. PATENT DOCUMENTS

| | | | | |
|---|---|---|---|---|
| 8,073,573 B2* | 12/2011 | Chassin | ................... | H02J 3/14 |
| | | | | 700/286 |
| 8,494,685 B2* | 7/2013 | Shaffer | ................... | G06F 9/50 |
| | | | | 700/291 |
| 2003/0078797 A1 | 4/2003 | Kanbara et al. | | |
| 2004/0257858 A1 | 12/2004 | Mansingh et al. | | |
| 2009/0292402 A1 | 11/2009 | Cruickshank | | |
| 2017/0040798 A1* | 2/2017 | Mazuelas | ............... | G06Q 50/06 |

* cited by examiner

SYSTEM AND METHOD FOR PLANNING OF DEMAND FOR POWER ON AN ELECTRICAL POWER NETWORK

CROSS REFERENCE TO RELATED APPLICATIONS

This application is a continuation of U.S. patent application Ser. No. 13/153,786, filed Jun. 6, 2011, which claims priority from prior Israel Patent Application No. 206,232, filed on Jun. 7, 2010 and entitled 'SYSTEM AND METHOD FOR PLANNING OF DEMAND FOR POWER ON AN ELECTRICAL POWER NETWORK', which are incorporated by reference herein.

FIELD OF THE INVENTION

The present invention relates generally to demand side management and specifically to planning of demand for power on an electrical power network.

BACKGROUND OF THE INVENTION

Electricity supply networks may face predictable demands for energy over an energy production period such as a day or week, and may plan the activation of power generators to supply power that meets the various demand levels during each interval of such period. Frequently, such generators are activated in an ascending order of price for generation of such power so that a generator that produces power most cheaply is activated first and may remain activated throughout the period, and a generator that produces power most expensively is activated last and may remain activated only during the peak demand intervals of such period.

SUMMARY OF EMBODIMENTS OF THE INVENTION

Embodiments of the invention may include a method for planning power demand on a power network, where the method includes calculating a prediction of power demand by a number of power consuming devices at a number of intervals. The method may include calculating an order of activation of a set of generators to meet a prediction of power demand at such number of intervals, where an activation of a first of a set of generators is sufficient to meet a power demand at a first interval of the intervals, and an activation of a first and a second generator is sufficient to meet the power demand at a second interval of the intervals. The method may include predicting that a power consuming device is to be active at the second interval and not active at the first interval. The method may include activating one or more power consuming devices at the first interval, and deactivating one or more power consuming device at the second interval.

In some embodiments, the method may include calculating a pair of intersections between a power demand curve and more than one power generation thresholds during a power generation cycle.

In some embodiments, the method may include calculating a time limit for which activation of a power consuming device may precede a predicted time of activation for a power consuming device without causing consumer inconvenience.

Embodiments of the invention may include a method for utilizing power of a power generator, where the method includes calculating a prediction of power demand on a network at intervals between a predicted time of activation of a first generator and a predicted time of activation of a second generator. The method may also include selecting a set of power consumption devices that are to be active after a time of activation of a first generator. The method may also include activating a group of power consumption devices from the set, where a sum of power demand from the set of activated power consumption devices plus the predicted power demand at a first of the intervals, approximates a power supply capacity of the first generator.

In some embodiments, a method may include identifying a power consumption device having a flexible activation schedule.

In some embodiments, a method may include identifying a nominal load of a set of power consumption devices that are to be active after a time of activation of the first generator.

Embodiments of the invention may include a method for predicting that total power demand on a network between a first time point and a second time point will be below a pre-defined threshold. The method may include selecting a set of power consumption devices that are to be active between the first time point and the second time point. The method may include designating for a first of the set of power consumption devices an activation period and a deactivation period between the first time point and the second time point. The method may include designating for a second of the set of power consumption devices an activation period and a deactivation period between the first time point and the second time point. The method may include activating the first set of power consumption devices during the designated activation period for the first set of power consumption devices between the first time point and the second time point. The method may include deactivating the first set of power consumption devices during the designated deactivation period between the first time point and the second time point, and activating the second set of power consumption devices during the designated activation period for the second set of power consumption devices between the first time point and the second time point; and deactivating the second set of power consumption devices during the designated deactivation period between the first time point and the second time point.

In some embodiments, a method may include calculating a minimum time of a deactivation of a power consumption device from among the first set of power consumption devices.

In some embodiments, a method may include calculating a minimum period of a deactivation of a power consumption device from among the first set of power consumption devices.

Embodiments of the invention may include a method for limiting a level of power production on a power network, where the method may include predicting a time that power demand on the network will reach a pre-defined level; causing an activation of one or more power consuming devices on the network at a period before that time; and causing a deactivation of the plurality of power consumption devices after that time.

In some embodiments, a method may include ordering the power consuming devices by a quantity of power consumed by the devices during a period of activation of such devices.

In some embodiments, the predefined level may be a level at which an additional power generator will be activated.

Embodiments of the invention may include a method of planning activation of power consumption devices on a network, where the method includes predicting a difference between a level of power demand on the network during a period and a level of power production on the network during the period; predicting a time for an activation of one or more power consumption devices during the period; activating a set of the one or more power consumption devices prior to the predicted time for the activation of the one or more power consumption devices, where a sum of power demanded by the set of power consumption devices approximates the difference between the level of power usage on the network during the period and the level of power production on the network during the period.

In some embodiments, a method may include calculating a maximum time prior to the predicted time for the activation of the power consumption device.

In some embodiments, a method may include calculating a sum of power demanded by the set of plurality of power consumption devices that were activated prior to the predicted time.

Embodiments of the invention may include a method for planning activation of one or more sources of power on a network during a period, where the method includes calculating a maximum power to be used on the network during the period; calculating a difference between the maximum power to be used and a prediction of power demand on the network at a time during the period; predicting a time for an activation of each of a group of power consumption devices during the period; and deactivating a set of power consumption devices from among the one or more power consumption devices at the predicted time, where a sum of power demanded by the set of power consumption devices approximates the difference between the maximum power demand and the prediction of power demand.

In some embodiments, a method may include identifying a set of generators on the network whose generation capacity is sufficient to generate the maximum power to be used on the network.

In some embodiments, a method may include predicting a total power to be demanded between a pair of crossing points on a power demand curve.

BRIEF DESCRIPTION OF THE DRAWINGS

Embodiments of the invention are illustrated by way of example and not limitation in the figures of the accompanying drawings, in which like reference numerals indicate corresponding, analogous or similar elements, and in which.

Figure 1:
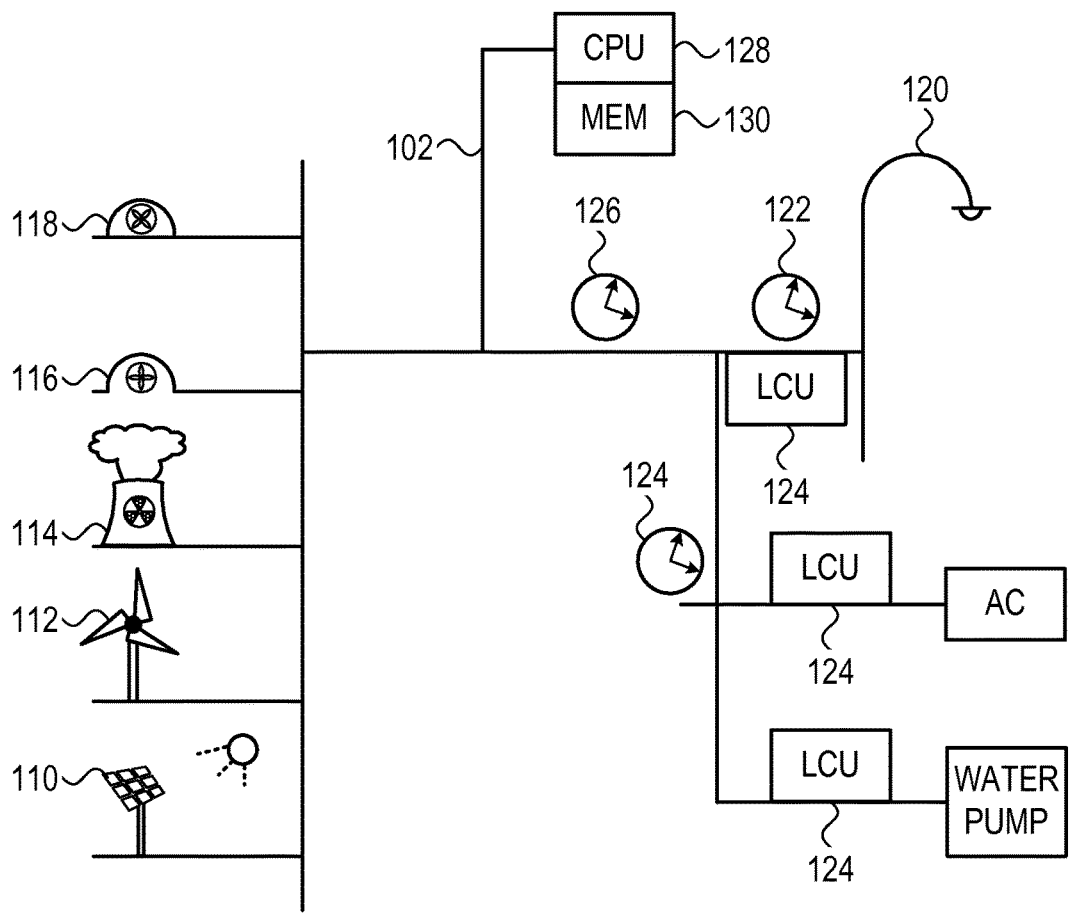
FIG. 1 is a simplified diagram of components connected to an electricity network in accordance with an embodiment of the invention.

It will be appreciated that for simplicity and clarity of illustration, elements shown in the figures have not necessarily been drawn to scale. For example, the dimensions of some of the elements may be exaggerated relative to other elements for clarity.

DETAILED DESCRIPTION OF THE INVENTION

In the following detailed description, numerous specific details are set forth in order to provide a thorough understanding of embodiments of the invention. However it will be understood by those of ordinary skill in the art that the embodiments of the invention may be practiced without these specific details. In other instances, well-known methods, procedures, and components have not been described in detail so as not to obscure the embodiments of the invention.

Unless specifically stated otherwise, as apparent from the following discussions, it is appreciated that throughout the specification, discussions utilizing terms such as "selecting," "evaluating," "processing," "computing," "calculating," "associating," "determining," "designating," "allocating", "comparing" or the like, refer to the actions and/or processes of a computer, computer processor or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

The processes and functions presented herein are not inherently related to any particular computer, network or other apparatus. Embodiments of the invention described herein are not described with reference to any particular programming language, machine code, etc. It will be appreciated that a variety of programming languages, network systems, protocols or hardware configurations may be used to implement the teachings of the embodiments of the invention as described herein. In some embodiments, one or more methods of embodiments of the invention may be stored on an article such as a memory device, where such instructions upon execution by for example a processor result in a method of an embodiment of the invention. In some embodiments, one or more processors may perform one or more of the processes described herein, or more that one of such processes may be performed by a single processor.

For ease of reference, abbreviations used in this application refer to the terms set forth below:

AAP(AP) Appliance Activation Plan—an array of ON, OFF and 'indifferent' settings for an appliance during a given period. Initially an Appliance may be set in an 'indifferent' position, to indicate that the Appliance may be manually set or may function in accordance with its own thermostat or other sensors;

AC Activation Coefficient—a probability that a certain appliance will be activated in a given period under given parameters p1, p2, p3 . . . AC may be computed as a ratio of nominal load and one hour sum of ADD(i,k);

ADD Appliance Daily Demand;

ADE Energy Available to Delay;

AP Instance of an appliance;

APE Energy Available to Precede;

APDE Delayed Energy Per Appliance—the amount of energy that is already delayed for an appliance;

APPE Preceded Energy Per Appliance—the amount of energy that is already preceded for an appliance;

AS Appliances Sequence—an array of appliances arranged in descending of energy used by such appliances;

CPP Crossing Point Pair—the crossing point of the energy demand curve with energy production thresholds in a first instance when the curve is rising and in a second instance when the curve is declining;

CPS Crossing Point Start time—a time when t1−1 is below a Threshold, and t1 is above Threshold, such that from the prior t to the present t a threshold was crossed;

CPE Crossing Point End;

DEN Deferred Energy—the amount of energy that has already been deferred;

DT Demand Resolution expressed as a fraction of an hour;

EAT Energy Above the Threshold;

EB Energy Balance—the potential energy between the demand curve and the threshold;

ETP(AP, t) Energy to Precede—what part of the energy of the appliance after time t is available to be preceded;

ETD(AP, t) Energy to Delay—what part of the energy used by the appliance before time t is available to be delayed;

i instance of a period or instance of a threshold;

k instance of a pair of crossing points;

LDT Last Deactivation Time(AP) the last time when the appliance AP was deactivated;

MDT(AP) Minimum Deactivation Time—a minimum period that the appliance should be kept off once it is turned off;

MTBD(AP, Px) Maximum Time Between Deactivations of an appliance, or how long a consumer will tolerate his appliance being off before the consumer complains, such maximum may depend on external parameters;

NDT Next Deactivation Time—the next time that an appliance will be deactivated;

NL(AP) Nominal Load of an appliance as specified by the manufacturer for a time period in which the appliance is activated;

PEN Preceded energy—the amount of energy usage already moved from under a demand curve to a time preceding the crossing point;

PEC Preceded Energy Counter—how much energy has been preceded; PL Production Level;

PD Planned Demand—the demand level sought to be achieved at a given i;

PTSE Possible to Shift Energy;

SE Shifted Energy;

TDD Total Daily Demand—an array of values of sums of demand in a series of intervals making up an energy cycle such as a day, broken into Dt intervals of eg 5 minutes. Other time intervals may be used;

TLN Threshold Level—how much power is produced upon reaching the threshold;

TLTD Time Limit to Delay—by how much time use of an appliance may be delayed;

TLTP Time Limit to Precede—by how much time a use of an appliance may be advanced;

In some embodiments, and in addition to their regular meanings, the terms 'service area' or 'network' may refer to all or some portion of an electrical network or grid that may include or have connected to it one or more generators of power and one or more demand sources, appliances or other users of power or power consuming devices. In some embodiments, a network or service area may include an area that is subject to a common time zone or common weather or environmental conditions. Smaller areas of a network may also be included as a network such that a portion of an electrical network that may include a set of power consumption devices and that may be served by a set of generators, may constitute a network. For example, a network of an industrial facility may include power consumption devices or appliances such as a smelter, a fabricator, cooling equipment and a water pump. The network of the facility may also include a set of one or more generators. Though the network may be connected to a larger network or grid, the network included in the facility may in accordance with an embodiment of the invention constitute an electrical network. In some embodiments, the limits of a given network may be changed in real time or dynamically in the course of a power production cycle so that additional power generation facilities and additional power consumption devices may be included in a calculation of power that may be preceded or delayed In some embodiments, and in addition to its regular meanings, the term 'appliance' may refer to a power consuming device or other source of power consumption or use, such as for example air conditioning equipment, industrial production equipment, water pumping equipment, transportation equipment etc.

In some embodiments, and in addition to its regular meanings, a 'power production period' or 'power production cycle' may refer to a time period that is suitable for tracking on a power demand curve, which in some embodiments, may also be suitable for a prediction of power demand in the period. A power production cycle may in some embodiments refer to a 24 hour or 12 hour period or other time period such as a period from one hour before dawn to approximately 11 PM. Other time periods of shorter or longer duration are possible.

In some embodiments, and in addition to its regular meanings, the term 'reserve' may mean an amount of power production as may be available for use or consumption in the event of contingencies. Such amount may be expressed as a percentage of power production, as an absolute value of power or in accordance with other formulae. In some embodiments, a calculation of power production as may be necessary to meet power demand at any time may include a reserve, such that the actual power produced or available for production exceeds the power demanded by some reserve amount. In some embodiments, inclusion of a reserve of power production may provide flexibility for calculations or approximations of power that may be preceded, delayed or otherwise avoided through an activation or inactivation of one or more appliances. In some embodiments, a reserve may be for example 5% or 10% of power production, though other sums or calculations are possible. In some embodiments, an approximation of power demand or demand of appliances to be deactivated or activated at a particular time may take into account the cushion or flexibility provided by the reserve of power production that may be retained.

In some embodiments, and in addition to their regular meanings, the terms 'activation' or 'deactivation' may include substantial or partial activation or deactivation of an appliance or other power consumption device. For example, use of an appliance at a lower or less than full power consumption level may be included in a 'deactivation' of such appliance even though the appliance may remain activated. Similarly, use of appliance at a higher level of power consumption that it would usually be used at a particular time may be referred to as activated, even though the appliance had been continuously on.

In some embodiments, a set of appliances may include one or more appliances that may be activated or deactivated in accordance with an embodiment of the invention. For example, a set of appliances may include some of the appliances on a network that may be subject to remote control by a signal delivered to such appliance by a processor that may execute an embodiment of the invention.

Embodiments of the invention may be performed through the execution by a processor or series of processors, of instructions or series of instructions such as software instructions. Embodiments of the invention may include a mass storage device that may store a series of instructions that when executed by a processor, may perform an embodiment of the invention.

Reference is made to FIG. 1, a simplified diagram of components connected to an electricity network. In some embodiments a power supply such as for example, one or more generators, turbines or other source of electric power 110, 112, 114, 116 and 118, may be connected to and supply electrical power over a network 102. Network 102 may provide power to one or more power demand sources 120 such as lights, transportation equipment, manufacturing facilities, water pumps, and air conditioning, heating and ventilation units. Some of such power demand sources 120 may be operable on flexible activation schedules. For example, a water pump that brings water up into a water tower may be activated for example at night or at other time periods where demand for power is low. Similarly, a water chiller that is part of an air conditioning unit may be activated at a particular period to chill water, and then deactivated during a second period when the water is already chilled and when for example power demand is high.

In some embodiments, power demand sources 120 may be fitted with one or more electric meters 122 and with one or more load control units 124 or other remote processors that may for example activate, de-activate, or reduce power demanded by power demand source 120, also referred to as appliances (AP). One or more main meters 126 may measure a power demand level of one, some or all of network 102. Such meters 126 may transmit demand data to for example one or more central computers 128, to other main meters 124 or to other components on the network 102 over for example a wide area network, telephone network, cellular network or the Internet.

In some embodiments, computer 128 may be connected to or associated with a data base 130 that may store power demand data from prior periods, power generation statistics, such as prices of power generated by sources of electric power 110, data on power usage characteristics of power demand sources 120 as well as other data. Computer 128 may be connected to one or more units 124 and may be empowered to activate or deactivate one or more power demand sources 120.

Figure 2:
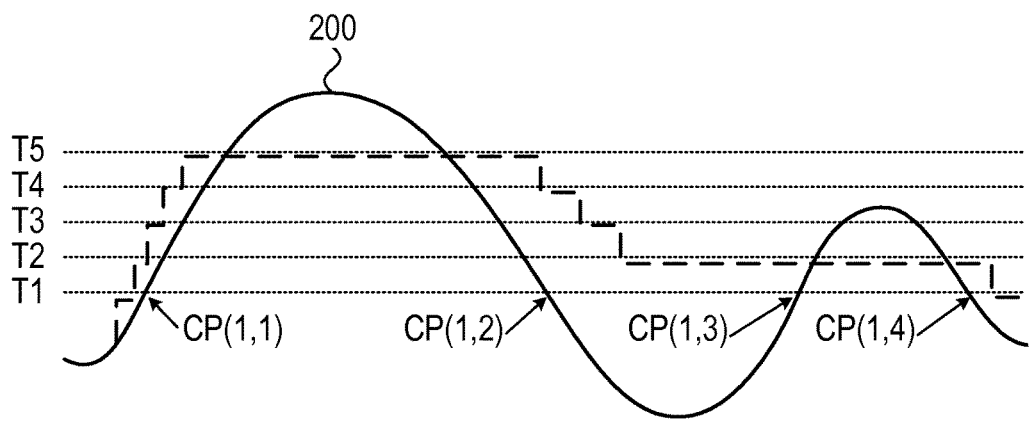
FIG. 2 is a simplified diagram of a power demand curve covering energy production periods, and power supply generation levels as they intersect with the demand curve to indicate one or more crossing points, in accordance with an embodiment of the invention.

Reference is made to FIG. 2, a simplified diagram of a power demand curve covering an energy production period or production cycle, and power supply generation threshold levels as they intersect with the demand curve, in accordance with an embodiment of the invention. For example, a power demand curve 200 may start at a low level of power use in for example the morning hours of a day, and the rise through the morning and early afternoon levels, fall towards late afternoon and rise again in towards evening before falling again at night. The power demand as is reflected by demand curve 200 may intersect with various thresholds (TL) TL1-TL5 that may represent for example varying levels of power production as may be achieved through the activation of additional generators. For example, production capacity may reach up to TL1 when a first generator is activated, and may reach up to TL2 when a first and a second generator are activated. In some embodiments, successive additional generators may be activated or deactivated through the energy production period to match actual or anticipated demand. In some embodiments, activation of generators is done in reverse order to their respective cost of power generation such that cheaper running generators are activated before generators whose power production is more expensive.

Intersection or crossing points (CP) of demand curve 200 and a particular threshold are designated as CP, where CP(1,1) is a first crossing of demand curve 200 with T1 and CP(1,2) is a second crossing of demand curve 200 with TL1. The total energy demanded (TD) may be the energy bounded by demand curve 200 and TL1 between the time of CP(1,1) and CP(1,2). In some embodiments, a CP(1,1) will typically be matched with a CP(1,2) indicating for example an activation time of a generator as power demand curve 200 is rising, followed by a later deactivation time of the generator when the power demand curve 200 is dropping. A matching pair of intersections of a power demand curve with a given TL may be deemed a crossing point pair (CPP). A first CP of a pair may be deemed a crossing pair start (CPS), and a second crossing point of a pair may be deemed a crossing pair end (CPE). CPS may be associated with a time t1 when total daily demand (TDD) of t1−1 is below a given TL, and t1 is above such TL, such that CPS is the first intersection point in the pair of the demand curve with the TL. CPE may be associated with t2 when TDD(t2−1) is above TL while TDD(t2) is below the TL. In some embodiments the total number of crossing points may be odd since there is some generation activated before the production cycle begins.

In operation, a method of the invention may calculate the TD between a pair of CP's, and may pre-use or precede and delay portions of such demand to time points outside of the predicted demand curve 200, thereby lowering a highest point of demand curve to a level that is below a TL, such as below TL5, thereby eliminating or reducing a need to activate for example a generator that has a high power generation cost. In some embodiments, a method of the invention may succeed in spreading and lowering a demand curve 200 so that it does not rise above some threshold, for example TL4, thereby eliminating a need to activate a generator with for example a higher power production cost.

Figure 3:
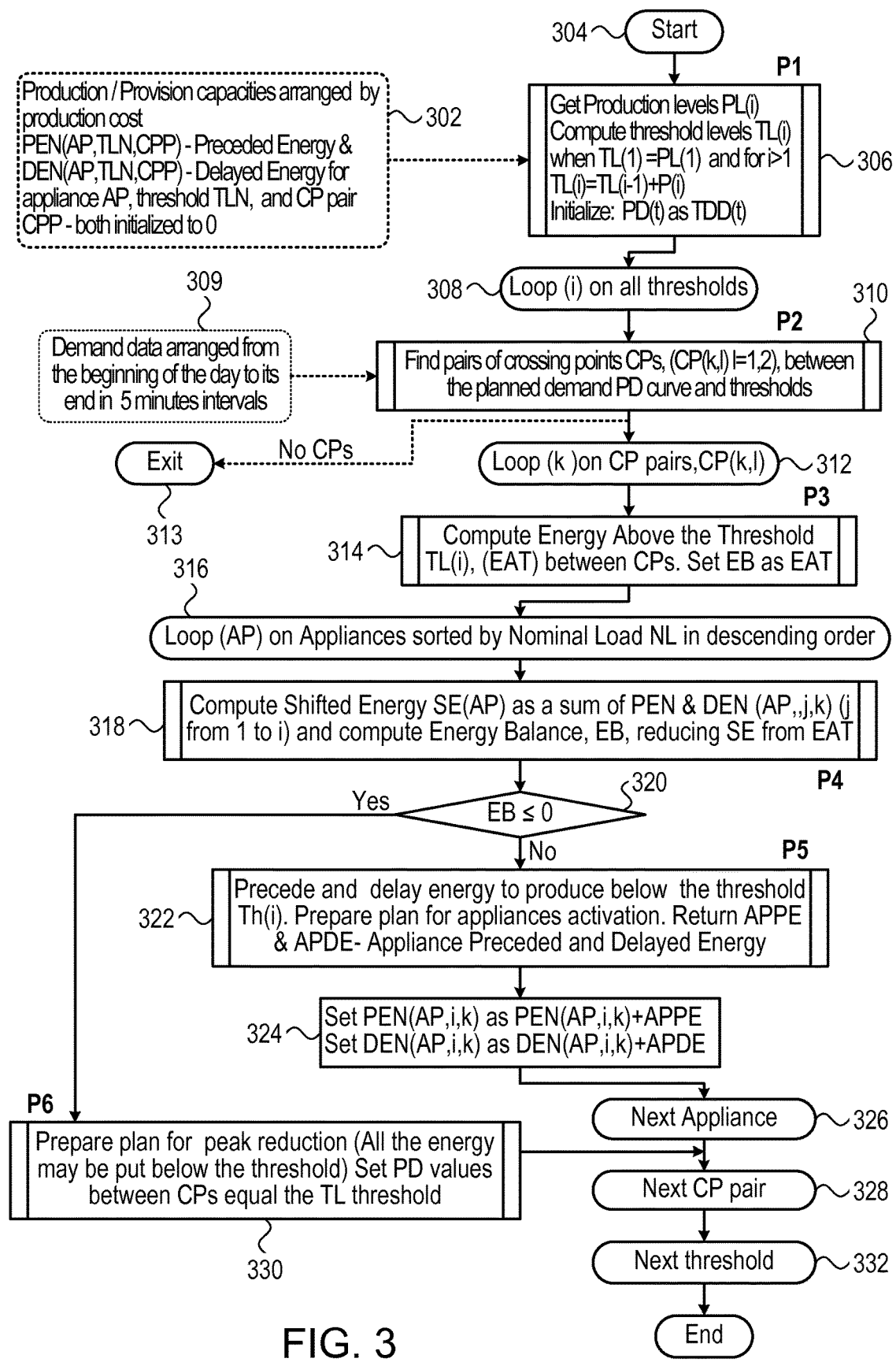
FIG. 3 is a flow diagram of a method of determining whether, and the extent to which, preceding demand and delaying demand may allow avoidance of need for activation of a high cost generator, in accordance with an embodiment of the invention.

Reference is made to FIG. 3, a flow diagram of a method of determining whether and the extent to which preceding demand and delaying demand may allow avoidance of a need for activation of a generator at a high TL, in accordance with an embodiment of the invention.

In block 304, a calculation may begin.

Block 302, a comment to the actions in block 306, indicates that a data base may arrange production capacities of generators by costs of such production so that a generator with cheaper production costs is predicted to be activated first. Certain variables may be designated and initialized at 0. For example, the variable Preceded Energy (PEN) may be designated to accrue energy demand that has been pre-used or pulled backwards in time from under demand curve 200 to a point prior to the intersection of demand curve 200 with the relevant CP. PEN may be accumulated or deemed a function of power preceded for one or more appliances (AP) or power demand sources, at one or more power TL's and for one or more set of CP's, such that PEN may be calculated for one or more AP, TL, and CP. Delayed energy (DEN) may be designated to include power consumption that is pushed forward in time from under the power demand curve 200 to a point later than the intersection of demand curve 200 and the relevant CP. DEN may likewise be accumulated or be calculated for one or more AP, TL and CP. DEN may also be initialized to 0.

In block 306, a power production level (PL) may be calculated and associated with one or more TL, such that a first TL1 is equal to a PL1. Thereafter, for i>1, TL(i)=TL(i−1)+PL(i). A variable of Planned Demand (PD), or is initially set to TDD, or the sum of an array of demand values collected from the demand encountered at each of a series of short intervals during a production cycle.

In block 308, i may be looped for all TL.

In block 309, a comment to the actions in block 310, demand data may be input from a utility or some load service entity, and demand data may be measured in for example 5 minute intervals during a production cycle of, for example, one day, such that the TDD may be the demand data from each of such 5 minute intervals. Other intervals may be used. The frequency of the computed demand intervals may be termed demand resolution (DT) and may be expressed as a fraction of an hour or other time measurement.

In block 310, CP (k,l) may be determined, and each CP(k,l), where k is a CP pair and l=1,2, in a CPP may be calculated. In block 312, CP may be looped for each k or pair of CP's. If no crossing points are detected in block 310, the process may terminate in block 313.

In block 314, a total energy above the threshold (EAT) as is bounded on top by the power demand curve, on the bottom by the TL(i) and on the sides by the CP(k,l) (l=1,2) may be calculated. EAT may be computed as SUM(TDD(t)−TL)*DT, for all time between CPS=CP(k,1) and CPE=CP(k,2).

In block 316, a process may begin for evaluating whether delaying or preceding energy usage for one or more of a series of AP, typically beginning with the appliances having the highest NL and proceeding in descending order, may lower an energy balance (EB) below the lowest possible TL intersected by the demand curve. This process may be repeated for each ascending TL that is intersected by the demand curve once the lower TL is calculated as insufficient to accommodate the EB. EB may be described as Energy Above the tested Threshold (EAT), after energy is preceded or delayed from under the demand curve. An EB of less than or equal 0 means that enough energy has been shifted so that demand curve does not cross the next higher threshold. The calculation looks for the lowest possible threshold where EB is 0 or less.

In block 318, the total shifted energy (SE) for an appliance may be calculated as the energy to be preceded and energy to be delayed for such appliance for each threshold between a crossing point start and crossing point end (AP, j, k) (j from 1 to i). SE may be subtracted from Energy above the Treshhold (EAT) to derive an Energy Balance (EB). SE may be a sum of PEN and DEN as were calculated for each AP, j,k, where j is incremented from 1 to i, where i is the current threshold number. In this process, EAT is reduced by the energy previously preceded or removed from under the demand curve for the examined appliance in the prior and also the current threshold. EB may be evaluated to determine in block 320, whether EB<=0.

In block 322, if EB is greater than 0, continue to precede and delay energy usage for AP in an attempt to keep power production below a current TL. In some embodiments, a process for preceding and delaying demand may involve preparing a plan for activation and deactivation of one or more AP's, such that, as is described in block 324, for each AP at each TL, the total preceded energy that has already been moved from under the predicted demand curve (Σ(PEN (AP,j,k)); j from 1 to i (i being the current TL number, and k being the CP number) to outside of the predicted demand curve is increased by energy preceded for such AP on the current TL (APPE). Similarly, total delayed energy for an AP from prior thresholds (Σ(DEN (AP,j,k)); j from 1 to i increased by the amount of energy demanded by such AP as can be moved outside of the predicted demand curve in respect of the current threshold (APDE). A result is that for the current threshold, TLi, PEN(AP,i,k)=PEN(AP,i,k)+APPE and DEN(AP,i,k)=DEN(AP,AP,i,k)+APDE. The EB calculation may be explained as an amount of energy left above a threshold between a CPP after each energy shift attempted as part of a preceding or delaying of energy of an AP. The shifting of energy usage by various APs from within to outside of the demand curve may result in reaching a lowest sufficient to sustain an EB of 0 or less.

In blocks 326 and 328, the attempt to reduce EB to 0 or below may proceed to further AP's and further CPP's.

Once a determination is made of a lowest TL that can meet an EB such that EB<=0, a plan may be formulated in block 330 for activation and deactivation of appliances as may be necessary to keep peak demand from temporarily or momentarily rising above such TL.

In block 332 the process of finding an energy balance that is less than or equal to 0 may be repeated for a subsequent threshold.

Figure 4:
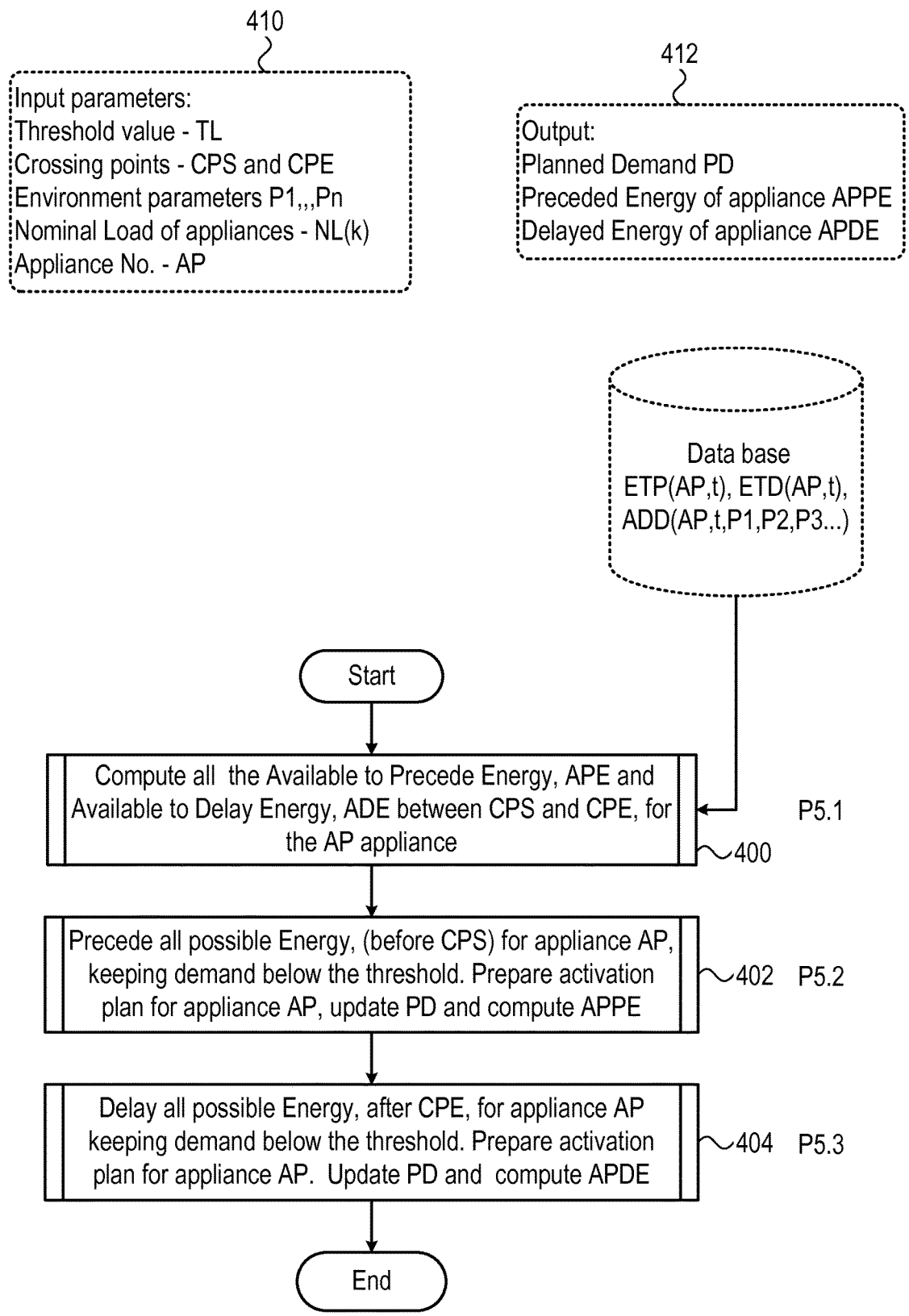
FIG. 4 is a flow diagram of a method determining a value of energy to be preceded and delayed around or between crossing points, in accordance with an embodiment of the invention.

FIG. 4 is a flow diagram of a method determining a value of energy to be preceded and delayed around crossing points so that at new demand curve is created, in accordance with an embodiment of the invention. In some embodiments, energy that is available to be preceded or delayed may be calculated for one or more pair of crossing points of a threshold level. Thus, as set forth in block 410, input parameters may include the relevant threshold, the crossing point start and the crossing point end are known as inputs to this calculation. Other inputs may include the data base of appliances that are equipped with activation and deactivation mechanisms that are suitable for accessing and controlling the appliances to delay or precede demand. Demand levels for such appliances may also be known and available as part of the calculation, as well as the impact of known environmental conditions and parameters (P1, P2, P3, etc.) on such demand levels of the appliance. Such demand levels may be known or calculable for the power production cycle period such as for example, a day, and may be termed an appliance daily demand (ADD). For example, a particular appliance such as an air conditioner may have a nominal load (NL) of 1000 kW, where NL is a manufacturer specification for the appliance's power demand On an hourly basis under given environmental parameters, this appliance may demand 440 kw. Such data may be stored in a data base that is associated with a processor that may implement a method in an embodiment of the invention.

In addition to a new or planned demand curve, as shown in block 412, an output of the calculation described in FIG. 4 may also include a sum of preceded energy per appliance (APPE) and delayed energy per appliance (APDE) for an appliance in respect of one set of crossing points of a threshold Such calculation may return a planned demand with changes to demand caused by the activation plan for the appliance and energy that was preceded or delayed in this specific iteration (APDE & APPE).

In block 400, there may be computed for each of a series of appliances, the energy available to be preceded (APE) from a crossing point start, and the energy available to be delayed (APE) from a crossing point end. A function for deriving APE may be as follows: APE=Σ(ADD(AP, t)*ETP(AP,t))t from CPS to CPE. A function for deriving ADE may be as follows: ADE=Σ(ADD(AP, t)*ETD(AP,t))t from CPS to CPE.

In block 402, the energy to be preceded as derived from block 400 may be calculated in respect of the appliance, such that the energy to be preceded for the appliance is to be demanded before the crossing point start. A plan may be formulated to activate the particular appliance or series of appliance in advance of the crossing point start, and the planned demand curve may be modified to account for the preceded demand. A counter for the preceded energy of the appliance may be updated.

In block 404, the energy to be delayed as derived from block 400 may be calculated in respect of the appliance, such that the energy to delay of the appliance is to be demanded after the crossing point end. A plan may be formulated to delay activation of the particular appliance or series of appliance for some interval before the crossing point end until after the crossing point end, and the planned demand curve may be modified to account for the delayed demand of the appliance. A counter for the delayed energy of the appliance may be updated.

Figure 5:
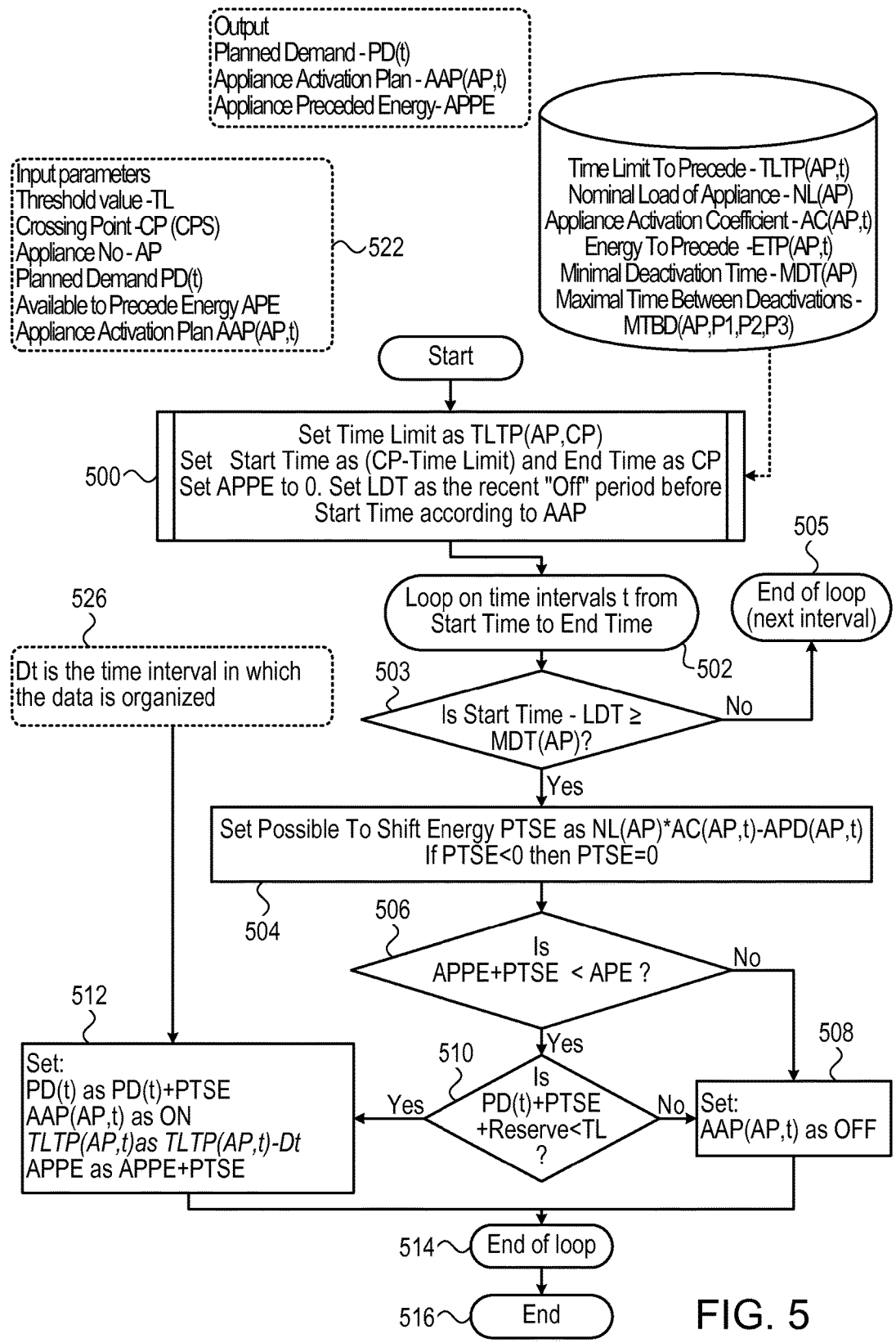
FIG. 5 is a flow diagram of a method of calculating energy to be preceded for an appliance in a series of appliances in accordance with an embodiment of the invention.

Reference is made to FIG. 5, a flow diagram of a method of calculating energy to be preceded for an appliance in a series of appliances, in accordance with an embodiment of the invention. The calculation described in block 402 of FIG. 4 is further elaborated in this FIG. 5, as a method of formulating an activation plan for preceding demand of an appliance, and determining a value for the energy to be preceded, in accordance with an embodiment of the invention. In block 520, a data base that is associated with a processor may store information about one or more appliances, where such data includes a time limit to precede usage of the appliance (TLTP), or by how much time an appliance may be activated in advance of a crossing point start while still preserving the functional effect of the activation of the appliance after the crossing point start. For example, a water chiller for an air conditioning unit may be activated one hour earlier in the morning to chill water 2 degrees lower than a usual temperature, and such lower initial chilling will suffice to adequately operate the air conditioning system for two hours after a crossing point start time. Any further attempt to precede activation of the chiller would have diminishing energy saving returns. In such case, the TLPT would be 2 hours. In some embodiments, TLPT may be derived and experimentally in some learning process when the system changes TLPT from time to time and determines if such change improves the energy return. TLPT may be set for different outdoor parameters such as temperature: (average, minimal and maximal) and humidity. The data base may also store a nominal load (NL) of the appliance and an activation coefficient (AC) for the appliance, which may be defined as the probability that an appliance will be active during a particular period under a given set of environmental parameters. In some embodiments an activation coefficient may be computed as a ratio of nominal load over fixed period of the appliance's daily demand. Also stored may be the total energy to be preceded for the threshold for the appliance during the period (ETP), a minimal deactivation period for the appliance, and a maximum time between deactivations (MTBD).

Block 522 shows the input variables for the calculations in FIG. 5. These include the current threshold value (TL) for which the calculation is pursued, the crossing points (CP), the appliance (AP), the planned demand (PD(t)), the planned demand for the appliance (APD(AP,t)), the energy available to precede energy (APE) and the appliance activation plan (APP).

In block 500, a time limit for consideration of the activation plan may be set as the TLTP of the appliance prior to the crossing point start, and the start time may be set as CPS minus such time limit, the end time of the activation plan may be set as the crossing point start, and appliance energy to be preceded (APPE) may be set to 0. Time of the last planned "off" state in the AAP array may be set in the LDT (last deactivation time) variable to assure that the if there was planned deactivation it will be performed at a minimum period from the prior deactivation as complied with the time recommended by manufacturer time MDT(AP). In block 502, the process may be looped for all t from the start time to the end time.

In block 503, a determination is made as to whether the last deactivation time of the appliance is at least equal to the minimal deactivation time of the appliance. If not, the loop is ended in block 505. If yes, the loop continues to block 504, In block 504, the a variable of energy possible for shifting (PTSE) may be set as the nominal load for the appliance times the activation coefficient for the appliance at such time. If the energy possible to be shifted (PTSE) for the appliance is less than zero, then restore such value to 0.

In block 506, a determination may be made as to whether the energy already preceded for the appliance plus the energy potential to be shifted exceeds the energy available to be preceded for the appliance at the particular time. If not, then the method proceeds to block 508 where the appliance activation plan is set to off for that time period meaning that all the available energy to precede for the appliance was preceded so the appliance should be off. Upon completion of 508, the loop may end. Leaving the appliance off at this stage is recommended since there is no energy saving at this point from activating the appliance outside of the demand curve. If yes, then the method proceeds to block 510 where a determination is made as to whether the planned demand that is to be achieved plus the energy possible to be shifted from under the existing demand curve, plus a reserve percentage of spare power production is less than the threshold. If not, then the method proceeds to block 508 as above. If yes, then the method proceeds to block 512 where the energy possible for shifting is added to the planned demand, the appliance activation plan for the relevant appliance is set to on, the time limit to precede is set as TLTP(AP,t)−Dt (where DT is the time interval for which the data is organized), and the potential to shift energy is added to the preceded energy for the appliance. Further, the energy possible to be shifted is added to the planned demand. Updates of TLTP and APPE are required for the creation of an activation/deactivation plan for the next threshold. In general, preceding or delaying activation of an appliance may be constrained by time and energy. In any particular threshold, the threshold itself is a further constraint since there may be a situation where there is still energy for some appliance that may be preceded, but such preceding may exceed the limits of the threshold. When a next threshold is considered, the appliance may be rechecked for an opportunity to precede or delay energy, and the time the time limit, TLTP, will be set to the period after it was checked in the previous threshold, TLTP(AP,t)−Dt.

Block 514 indicates the end of an iteration of the loop. Block 516 indicates the end of the process once the evaluation has been applied to all relevant appliances.

Figure 6:
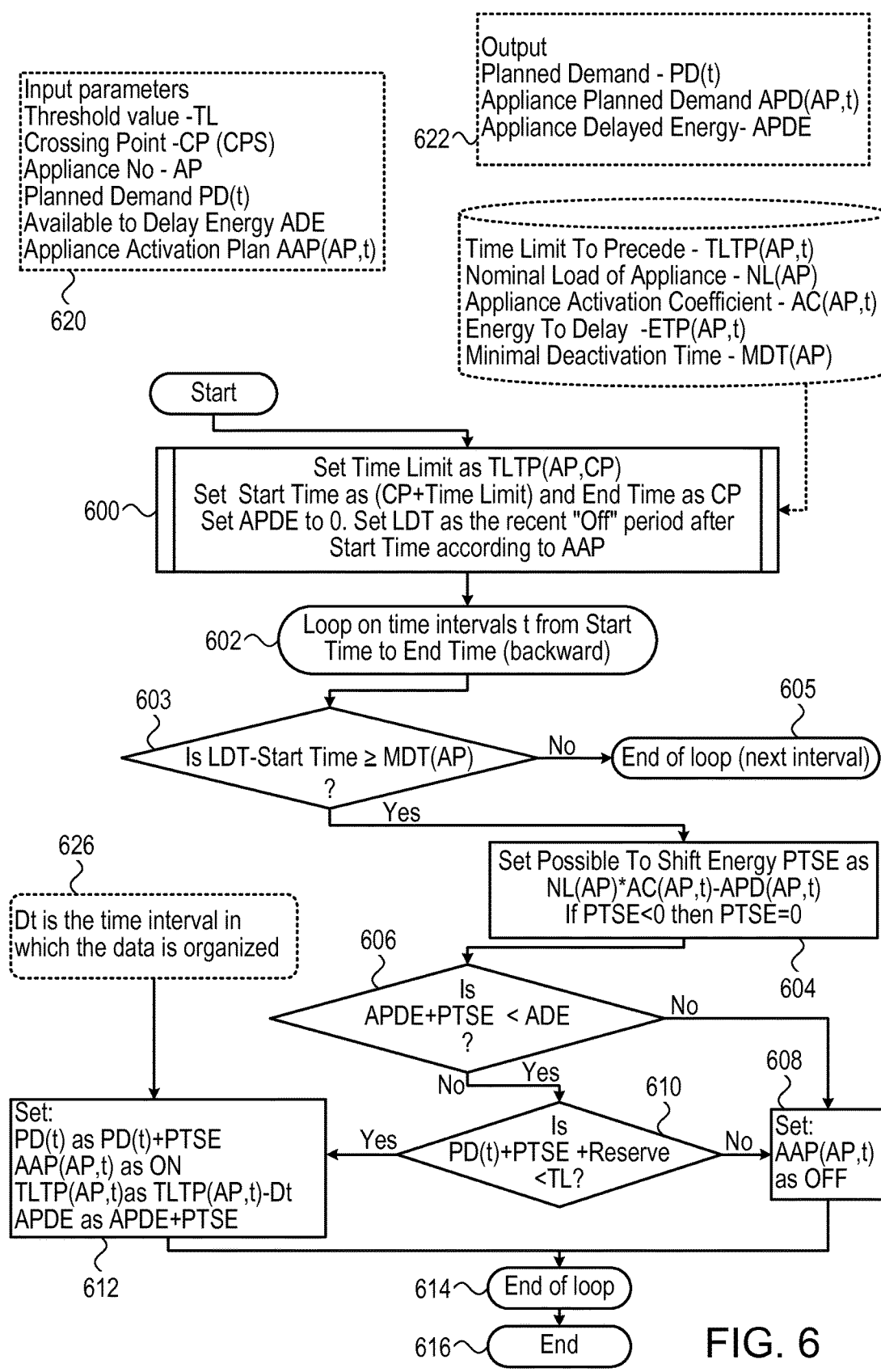
FIG. 6 is a flow diagram of a method of calculating energy to be delayed for an appliance in a series of appliances in accordance with an embodiment of the invention.

Reference is made to FIG. 6, a flow diagram of a method of calculating energy to be delayed for an appliance in a series of appliances in accordance with an embodiment of the invention. The calculation described in block 402 of FIG. 4 is further elaborated in this FIG. 6, as a method of formulating an activation plan for delaying demand of an appliance, and determining a value for the energy to be delayed. Block 620 lists the input parameters for the calculations in FIG. 6, and block 622 lists the output parameters for the calculations in FIG. 6. In block 624, a data base that is associated with a processor may store information about one or more appliances, where such data includes a time limit to delay usage of the appliance (TLTP), or by how much time an appliance may be activated after a crossing point end while still preserving the functional effect of the appliance before the crossing point end. For example, a water pump for a water tower may be activated one hour later in the evening, i.e. after the crossing point end, without adversely affecting the amount of water available to users. In such case, the TLPT would be 1 hour. The data base may also store a nominal load (NL) of the pump and an activation coefficient (AC) for the pump, which may be defined as the probability that the pump will be active at any given moment during a particular period such as the one hour of the TLPT, under a given set of environmental parameters. In some embodiments an activation coefficient may be computed as a ratio of nominal load over fixed period of the appliance's daily demand.

In block 600, a time limit for consideration of the activation plan may be set as the TLTP of the appliance after the crossing point end, and the start time may be set as CPE plus such time limit, the end time of the activation plan may be set as the crossing point end plus the time limit, and appliance energy to be delayed (APDE) may be set to 0. In block 602, the process may be looped backward or in reverse for all t from the start time to the end time. The last deactivation time variable is set to the most recent deactivation period after the relevant start time of this calculation.

In block 603, a determination may be made as to whether the last deactivation time minus the start time is greater than the minimal deactivation period for the appliance. If no, the loop ends for this interval in block 605. If yes, the loop continues to block 604.

In block 604, the a variable of energy possible for shifting (PTSE) may be set as the nominal load for the appliance times activation coefficient for the appliance at such time. If PTSE is less than 0, restore it to 0.

In block 606, a determination may be made as to whether the energy already delayed for the appliance plus the energy potential to be shifted exceeds the energy to available to delay (ADE) for the appliance at the particular time. If not, then the method proceeds to block 608 where the appliance activation plan is set to off for that time period and the loop is ended. If yes, then the method proceeds to block 610 where a determination is made as to whether the planned demand that is to be achieved plus the energy possible to be shifted from under the existing demand curve, plus a reserve percentage of spare power production is less than the threshold. If not, then the method proceeds to block 608 as above. If yes, then the method proceeds to block 612 where the energy possible for shifting is added to the planned demand, the appliance activation plan for the relevant appliance is set to on, the time limit to delay is set as TLTD(AP,t)−Dt, and the potential to shift energy is added to the delayed energy for the appliance. As is indicated in block 626, a comment to block 612, the variable Dt represents a time interval that is updated to track the use of the appliance for calculations in the next threshold. These last updates to the TLTD and APDE are required for the creation of an activation/deactivation plan for the next threshold. Block 614 indicates the end of an iteration of the loop. Block 616 indicates the end of the process once the evaluation has been applied to all relevant appliances.

Figure 7:
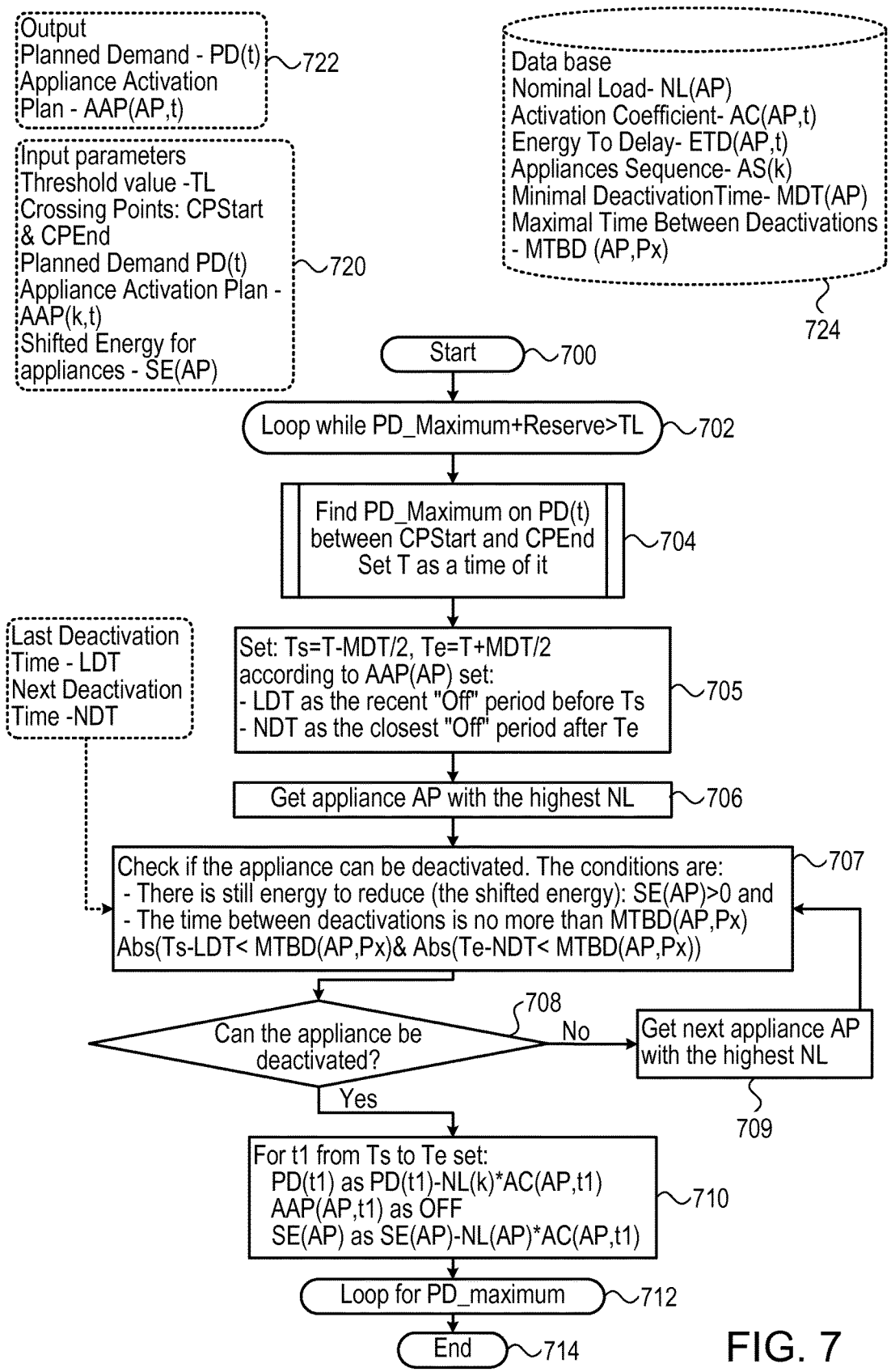
FIG. 7 is a flow diagram of a process for coordinating activation and deactivation of appliances in order to keep total demand from exceeding a particular threshold that is above an energy balance point in accordance with an embodiment of the invention.

Reference is made to FIG. 7, a flow diagram of a process for coordinating activation and deactivation of appliances in order to keep total demand from exceeding a particular threshold that is above the energy balance point, in accordance with an embodiment of the invention. In some embodiments, a process of shifting by delaying, preceding or otherwise, of demand from inside a predicted demand curve to outside the predicted demand curve, may indicate that total demand or the energy balance may, at least theoretically be kept below a particular threshold. In practice, however, coordination of appliance activation may be helpful in preventing actual demand from spiking above a threshold, where such spikes would otherwise require activation of additional power supply resources.

Block 720 lists data input for development of a plan for peak reduction, and block 722 list the output data for the calculations. Block 724 includes a list of variables that may be used and updated in the course of the calculations of this FIG. 7. These variables may include nominal load for each relevant appliance and an activation coefficient for each relevant appliance, a sequence of relevant appliances ordered descendingly by the respective power demanded by such appliances (AS(k)), a minimum time for which a relevant appliance may be deactivated (MDT(AP)), as may be dictated by for example a recommendation of a manufacture of the appliance, and a maximum time between deactivations (MTBD(AP,Px)) of an appliance, as may similarly be dictated by a recommendation of a manufacturer of an appliance or empirically from past consumer complaints about interval lengths that an appliance was previously set to off. Data that may also be known for the execution of a plan for peak reduction includes the relevant threshold (TL), the relevant crossing point start (CPS) and end (CPE) times, the planned demand (PD(t)), as may have been derived from for example FIG. 4 through FIG. 6, the appliance activation plan (AAP(k,t)) as may have been derived from for example FIGS. 5 and 6 and shifted energy for appliances (SE(AP)).

A set of variables may be designated for each relevant appliance called last deactivation time (LDT) and next deactivation time (NDT). These variables track deactivations of an appliance to prevent consumer inconvenience or discomfort that may be caused by too frequent shut downs of an appliance by tracking the time between a previous and current deactivation, and between a current and next deactivation, and prevent such deactivations from exceeding the MTBD limitation.

In block 700, a process may start and in block 702 a loop may be initiated which may continue so long as the maximum planned demand level (PD-Maximum) for the given threshold plus a predefined power reserve figure, is below the given threshold.

In block 704, time (t) may be set for a first time that PD-Maximum is reached on the planned demand curve between the crossing point start and the crossing point end.

In block 705 time start (Ts) of the deactivation is set as T−MDT/2 and time end of the deactivation is set as T+MDT/2. A check is made for the last deactivation time, LTD, prior to Ts and the next deactivation time, NTD, after Te on AAP to determine if the proposed deactivation period will comply with the MTBD. It should be noted that the deactivation periods may not necessarily be set in the chronological order, so a deactivation may be for appliance AP first for a period after Te.

In some embodiments, in block 706, the appliances in an array that are available for deactivation at time t are checked in descending order of power demand so that the largest appliance are evaluated first so as to gain the largest possible power saving from a single deactivation.

In block 707 a test for availability of an appliance for deactivation is performed. Such test may evaluate whether SE(AP)>0, indicating that not all the shifted energy was used in other appliances, and may evaluate whether the deactivation period is far enough from the previous deactivation period, Abs (Ts−LTD)>MTBD and from the next deactivation period Abs (Te−NTD)>MTBD. In block 708, the conditions of block 708 are evaluated to determine whether the relevant appliance can be deactivated at the particular T.

If the appliance cannot be deactivated at that time, then the process continues to block 709 and an appliance with the next highest NL as was determined in block 706, may be chosen. The process may return to the evaluation in block 707 on such next appliance. If the appliance can be deactivated at that time, then the process continues to block 710. In block 710, for each τ1 from Ts to Te, set:

PD(t1) as PD(t1)−NL(k)*AC(AP,t1), to reduce the planned demand by the projected load removed from the demand as a result of the deactivation of a relevant appliance;

AAP (AP, t1) as off to set the appliance to off. SE(AP) as SE(AP)−NL(AP)*AC(AP, t1) to reduce the shifted energy by the projected load removed from the demand as a result of the deactivation of the relevant appliance.

In block 712, the process is repeated for all relevant times so long as total demand remains under the relevant threshold. The process ends in block 714

Figure 8:
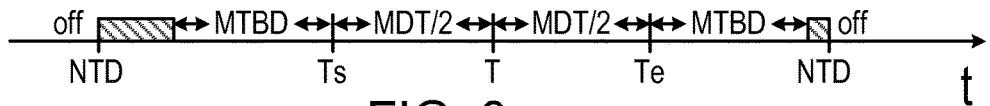
FIG. 8 is a diagram of a time line for activation and deactivation of an appliance, in accordance with an embodiment of the invention.

Reference is made to FIG. 8, a diagram of a theoretical time line and time selection process for activation and deactivation of an appliance, in accordance with an embodiment of the invention. Time T may indicate a point in time where for example there is a peak demand and where an appliance may be deactivated to reduce the peak. The period from Ts to Te may represent a total minimum deactivation time (MDT) for the appliance, as the manufacturer's recommended minimum time that the appliance may be switched to off before it is switched back to on. The MDT may be divided into basically equal periods around the peak time of T. On either side of the deactivation time there may be a period of activation or mean time between deactivations (MTBD) where the appliance is on. This period may be a manufacturer's recommendation or may be a period learned empirically from use of an appliance and consumer inconvenience from having the appliance deactivated for extended period. The period before and after the MTBD may represent the previous (PTD) and next (NTD) deactivation/activation cycles of the appliance.

Figure 9:
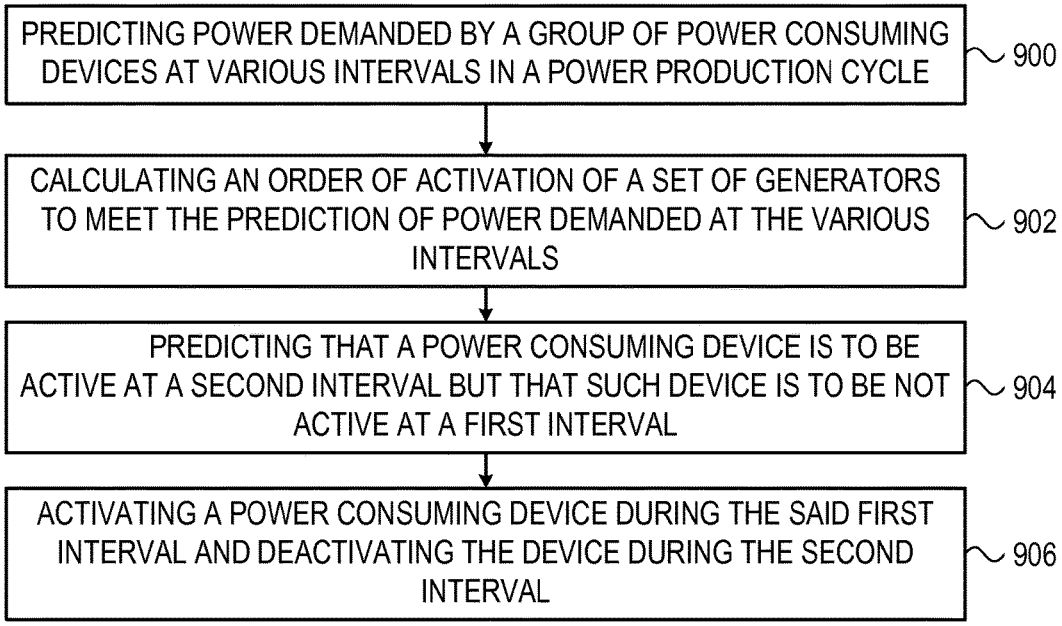
FIG. 9 is a flow diagram of a method in accordance with an embodiment of the invention.
Figure 10:
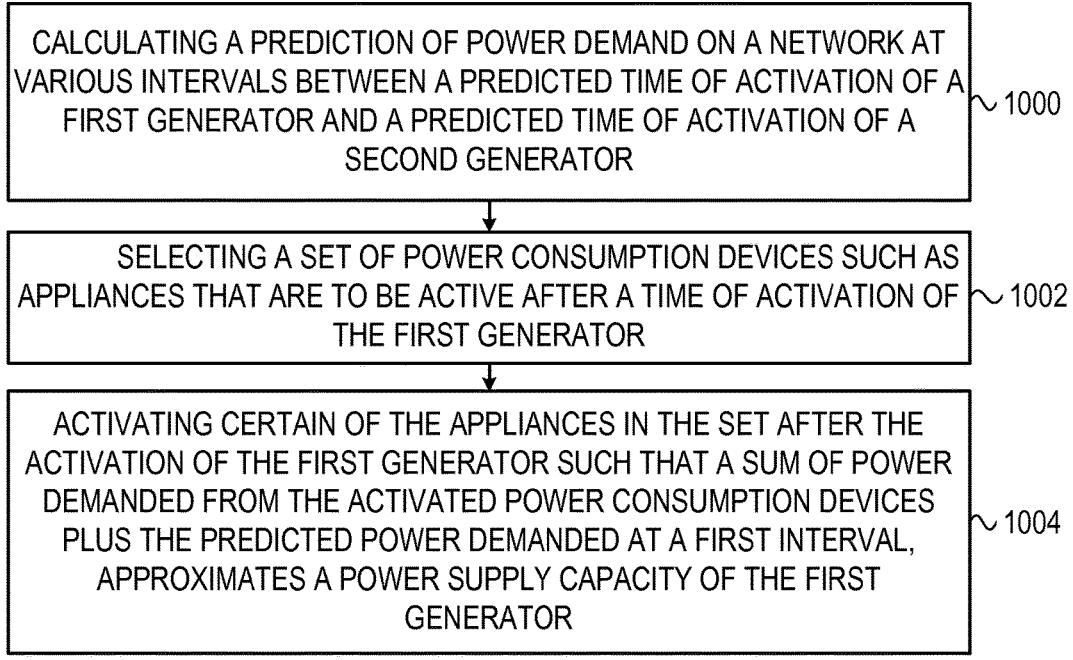
FIG. 10 is a flow diagram of a method in accordance with an embodiment of the invention.

Reference is made to FIG. 9, a flow diagram of a method in accordance with an embodiment of the invention. In some embodiments, and in block 900, a method for planning power demand may include calculating a prediction of power demanded by a group of power consuming devices at various intervals in a power production cycle. In block 902, an order of activation of a set of generators may be calculated to meet the prediction of power demanded at the various intervals, such that an activation of a first generators is sufficient to meet power demanded at a first interval, and an activation of the first and a second generator is sufficient to meet the power demanded at a second interval. In block 904, a prediction may be formulated that a power consuming device as included in block 900, is to be active at the second interval but that such device is to be not active at the first interval. In block 906, a power consuming device may be activated during the said first interval and deactivated during the second interval Reference is made to FIG. 10, a flow diagram of a method in accordance with an embodiment of the invention. In some embodiments, a method for utilizing power of a power generator may include in block 1000 calculating a prediction of power demand on a network at various intervals between a predicted time of activation of a first generator and a predicted time of activation of a second generator. In block 1002, there may be selected a set of power consumption devices such as appliances that are to be active after a time of activation of the first generator. In block 1004, certain of the appliances in such set may be activated after the activation of the first generator such that a sum of power demanded from the activated power consumption devices plus the predicted power demanded at a first interval, approximates a power supply capacity of the first generator.

Figure 11:
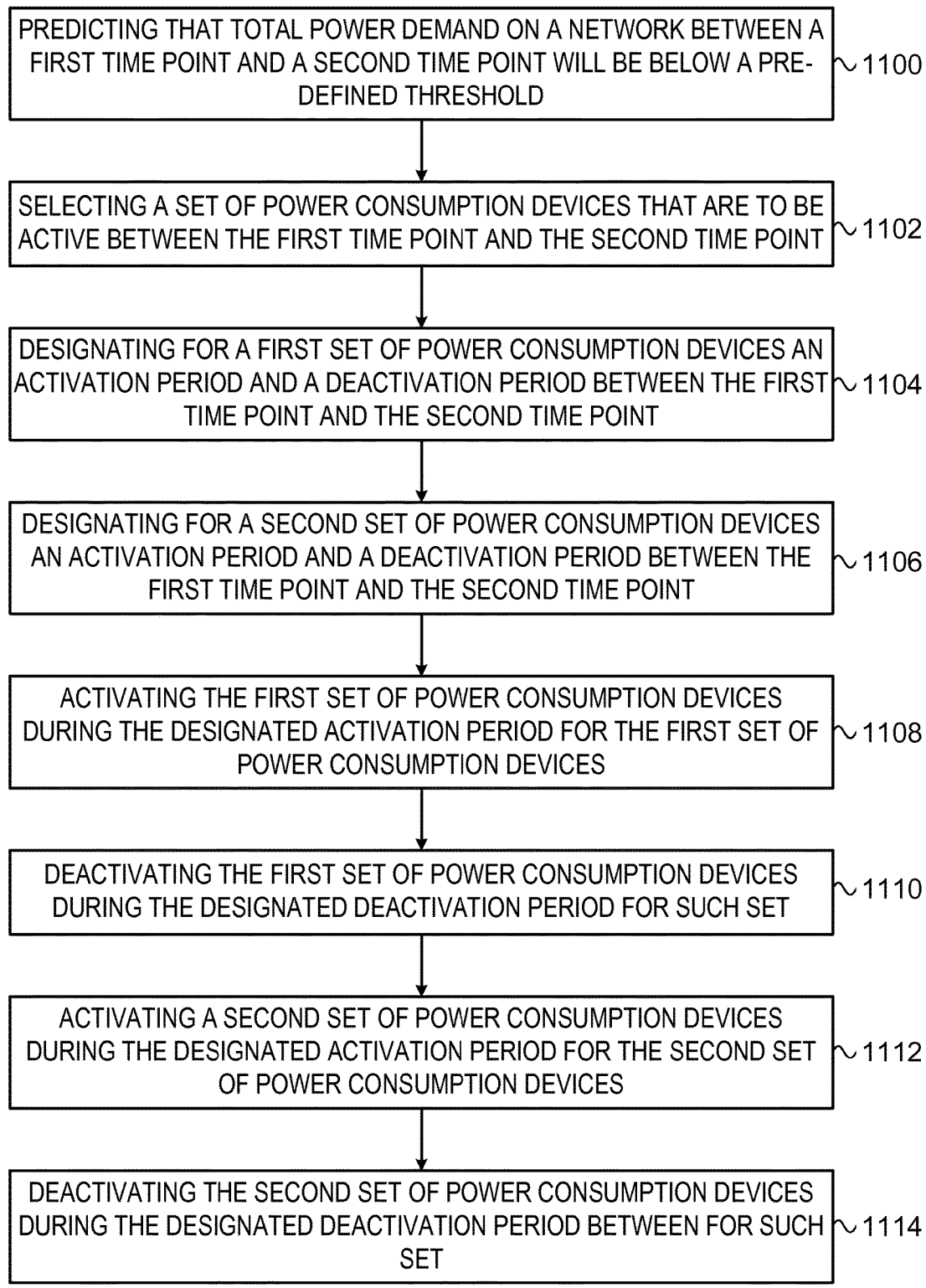
FIG. 11 is a flow diagram of a method in accordance with an embodiment of the invention.
Figure 12:
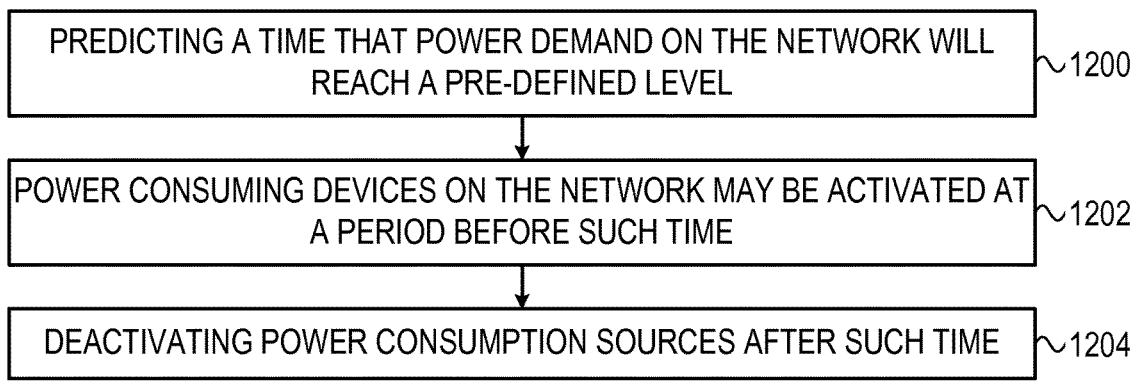
FIG. 12 is a flow diagram of a method of limiting a level of power production on a power network, in accordance with an embodiment of the invention.

Reference is made to FIG. 11, a flow diagram of a method in accordance with an embodiment of the invention. In some embodiments, and in block 1100, a method may include predicting that total power demand on a network between a first time point and a second time point will be below a pre-defined threshold. In block 1102, there may be selected a set of power consumption devices that are to be active between the first time point and the second time point. In block 1104, there may be designated for a first set of power consumption devices an activation period and a deactivation period between the first time point and the second time point. In block 1106, there may be designated for a second set of power consumption devices an activation period and a deactivation period between the first time point and the second time point. In block 1108, the first set of power consumption devices may be activated during the designated activation period for the first set of power consumption devices. In block 1110, the first set of power consumption devices may be deactivated during the designated deactivation period for such set. In block 1112, a second set of power consumption devices may be activated during the designated activation period for the second set of power consumption devices. In block 1114, the second set of power consumption devices may be deactivated during the designated deactivation period between for such set Reference is made to FIG. 12, a flow diagram of a method of limiting a level of power production on a power network in accordance with an embodiment of the invention. In block 1200, a prediction may be made of a time that power demand on the network will reach a pre-defined level. In block 1202, power consuming devices on the network may be activated at a period before such time. In block 1204, power consumption sources may be deactivated after such time.

Figure 13:
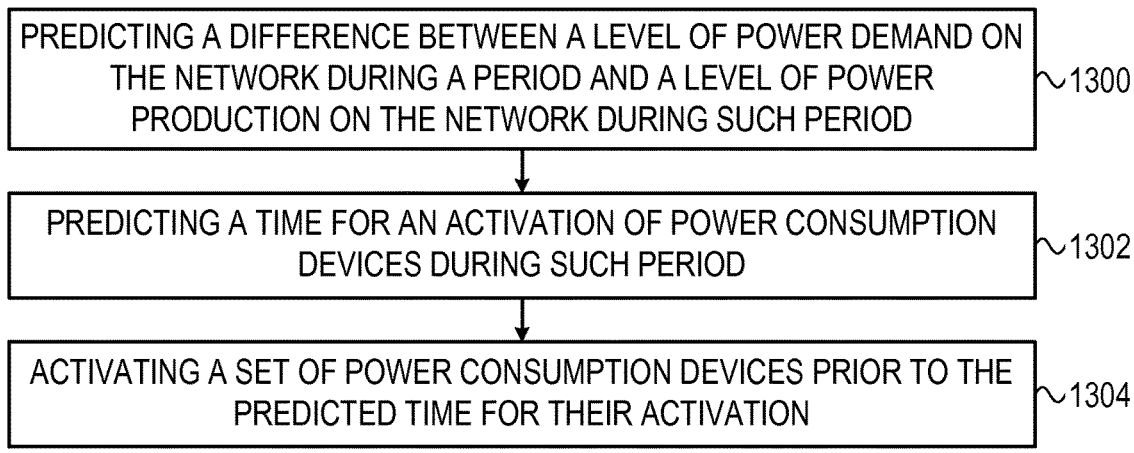
FIG. 13 is a flow diagram of a method planning activation of power consumption devices on a network, in accordance with an embodiment of the invention.

Reference is made to FIG. 13, a flow diagram of a method planning activation of power consumption devices on a network in accordance with an embodiment of the invention. In some embodiments, and in block 1300, a prediction may be made of a difference between a level of power demand on the network during a period and a level of power production on the network during such period. In block 1302, a prediction may be made of a time for an activation of various power consumption devices during such period. In block 1304, a set of power consumption devices may be activated prior to the predicted time for their activation so that a sum of the power demanded by the set of activated power consumption devices approximates the difference between the level of power usage on the network during the period and the level of power production on the network during the period.

Figure 14:
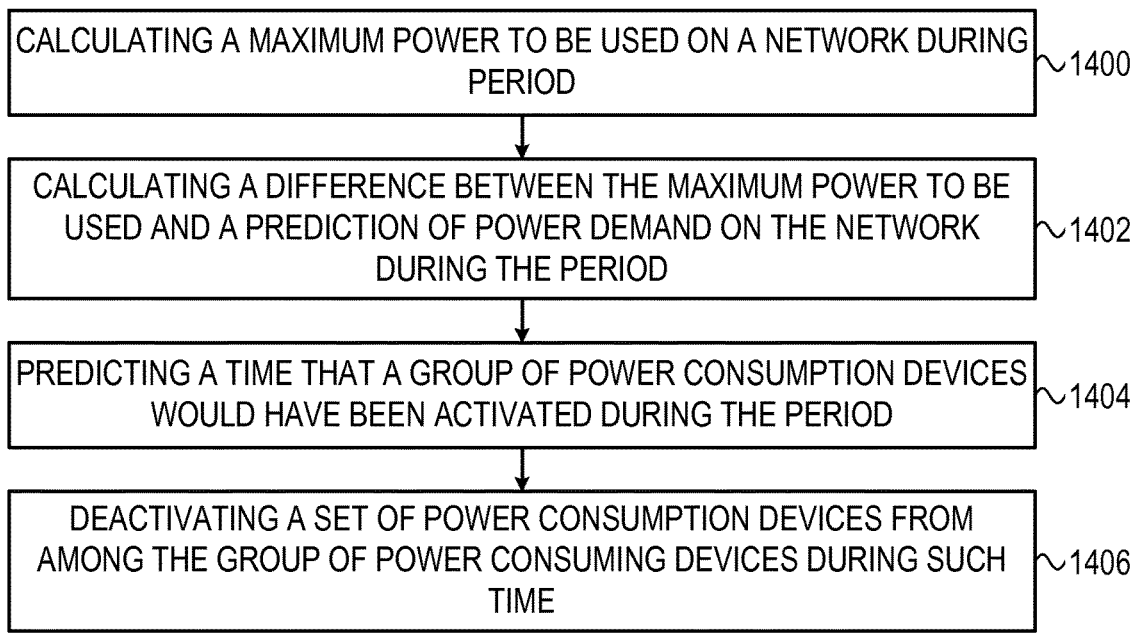
FIG. 14 is a flow diagram of a method planning activation of sources of power on a network during a period, in accordance with an embodiment of the invention.

Reference is made to FIG. 14, a flow diagram of a method planning activation of a plurality of sources of power on a network during a period, in accordance with an embodiment of the invention. In block 1400 a calculation may be made of a maximum power to be used on the network during the period. In some embodiments, this maximum power may be the power produced at the threshold that is to the limit of production during a power production cycle. In block 1402, a calculation may be made of a difference between the maximum power to be used and a prediction of power demand on the network during the period. In block 1404, a prediction may be made of a time that a group of power consumption devices would have been activate during the period, assuming inaction by a system implementing an embodiment of the invention. In block 1406, a set of power consumption devices from among the group of power consumption devices may be deactivated at the predicted time, such that a sum of power demanded by the set of power consumption devices approximates the difference between the maximum power to be demanded and the prediction of power that would otherwise have been demanded.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

I claim:

1. A method of utilizing power of a power generator, comprising:
    calculating a prediction of power demand on a power network at a plurality of intervals between a predicted time of activation of a first generator and a predicted time of activation of a second generator;
    selecting a set of power consumption devices that are to be active after a time of activation of said first generator; and
    activating a plurality of power consumption devices from said set, wherein a sum of power demand from said set of activated power consumption devices plus said predicted power demand at a first of said intervals, approximates a power supply capacity of said first generator.

2. The method as in claim 1, comprising identifying a power consumption device from said set, said identified power consumption device having a flexible activation schedule.

3. The method as in claim 1, comprising identifying a nominal load of said set of power consumption devices that are to be active after said predicted time of activation of said first generator.

4. The method as in claim 1, comprising calculating a time limit for which activation of a first of said set of power consumption devices may precede a predicted time of activation for first of said set of power consumption devices, without causing consumer inconvenience.

5. The method as in claim 1, comprising calculating a pair of intersections between a power demand curve and a plurality of power generation thresholds during a power generation cycle.

6. A method comprising:
    predicting that total power demand on a network between a first time point and a second time point will be below a pre-defined threshold;
    selecting a set of power consumption devices that are to be active between said first time point and said second time point;
    designating for a first of said set of power consumption devices an activation period and a deactivation period between said first time point and said second time point;
    designating for a second of said set of power consumption devices an activation period and a deactivation period between said first time point and said second time point; and
    activating said first set of power consumption devices during said designated activation period for said first set of power consumption devices between said first time point and said second time point;
    deactivating said first set of power consumption devices during said designated deactivation period between said first time point and said second time point;
    activating said second set of power consumption devices during said designated activation period for said second set of power consumption devices between said first time point and said second time point; and
    deactivating said second set of power consumption devices during said designated deactivation period between said first time point and said second time point.

7. The method as in claim 6, comprising calculating a minimum time of a deactivation of a power consumption device from among said first set of power consumption devices.

8. The method as in claim 6, comprising calculating a minimum period of a deactivation of a power consumption device from among said first set of power consumption devices.

9. A method of planning activation of power consumption devices on a network, comprising:
    predicting a difference between a level of power demand on said network during a period and a level of power production on said network during said period;
    predicting a time for an activation of a plurality of power consumption devices during said period;
    activating a set of said plurality of power consumption devices prior to said predicted time for said activation of said plurality of power consumption devices, wherein a sum of power demanded by said set of plurality of power consumption devices approximates said difference between said level of power usage on said network during said period and said level of power production on said network during said period.

10. The method as in claim 9, comprising calculating a maximum time prior to said predicted time for said activation of said power consumption device.

11. The method as in claim 9, comprising calculating a sum of power demanded by said set of plurality of power consumption devices that were activated prior to said predicted time.

* * * * *